United States Patent [19]

Bittel et al.

[11] Patent Number: 5,018,983

[45] Date of Patent: May 28, 1991

[54] ELECTRICAL ADAPTER FOR INTERCONNECTION WITH A SWITCH

[75] Inventors: Robert W. Bittel, Parma Hts.; Jules W. Rhine, Jr., Lyndhurst, both of Ohio

[73] Assignee: Lucerne Products, Inc., Hudson, Ohio

[21] Appl. No.: 411,725

[22] Filed: Sep. 25, 1989

[51] Int. Cl.⁵ ........................ H01R 23/02; H05K 1/18

[52] U.S. Cl. ........................ 439/76

[58] Field of Search ........................ 439/568, 620, 76; 310/50, 71

[56] References Cited

U.S. PATENT DOCUMENTS

| | | | |
|---|---|---|---|
| 13,535 | 2/1913 | Rodrigues | 439/357 |
| 3,336,490 | 8/1967 | Yelpo et al. | 310/50 |
| 3,919,573 | 11/1975 | Schmuck | 310/50 |
| 4,466,686 | 8/1984 | Houser | 439/814 |
| 4,723,115 | 2/1988 | Apter | 439/620 |

*Primary Examiner*—Neil Abrams

*Attorney, Agent, or Firm*—Renner, Kenner, Greive, Bobak, Taylor & Weber

[57] ABSTRACT

An electrical adapter is provided for interconnection with a switch intended for interconnecting a line voltage with a motor. The adapter has four blades extending therefrom for receipt by plug-in receptacles for the switch. The adapter, through a printed circuit board, interconnects the blades with receptacles for receiving wires from a motor, from a filter, and from a line voltage. The line voltage connectors are of the screw-in type, allowing the adapter to convert a switch having plug-in connectors to one having screw-in connectors for the line voltage.

14 Claims, 3 Drawing Sheets

ELECTRICAL ADAPTER FOR INTERCONNECTION WITH A SWITCH

TECHNICAL FIELD

The invention herein resides in the art of electrical adapters and, more particularly, to an adapter for interconnection with a switch, allowing the switch to be converted from one employing plug-in connectors to one employing screw-in connectors.

BACKGROUND ART

Electrical hand tools and the like typically incorporate on-off switches or other means for applying and/or regulating the application of line current to a motor. Such switches may either apply full line current to the motor or, through a variable resistance or other control network, the power to the motor may be regulated or controlled. In either case, interconnections are necessarily made between wires providing a line voltage and wires interconnected with the motor. Such interconnections may typically be made in the United States by the use of plug-in connectors of the type in which a wire is simply inserted into engagement with a spring clip which urges the wire into conducting communication with an appropriate terminal. However, some approval agencies, particularly those in countries other than the United States, require that wires to a unit carrying line voltage be secured by means of screw-in connectors, in which the wire is inserted into one bore of the connector and secured therein by means of a screw received within an interconnecting threaded bore. Obviously, this latter type of interconnection is more complex and more expensive than the plug-in connector.

Typically, United States manufacturers design their equipment for implementation of plug-in connectors. When the product is sold abroad, it must be converted for the screw-in terminals in order to receive appropriate approval in the foreign market. Rather than redesign the entire switch assembly to accommodate the different terminals, it is most desired that an adaptor be provided to convert the plug-in terminal for the line voltage to a screw-in terminal for such markets.

It is further known that the use of filters or noise suppressors between the line source and motor in hand tools and the like is most desirable to filter out and/or reduce voltage spikes, transients, and the like. Accordingly, for any adaptor of the type mentioned above, it is important to provide a means for including a filter or noise suppressor.

Previously, no adapters for converting from plug-in to screw-in terminals were known, particularly those which include the provision of implementing a filter device across the line and motor.

DISCLOSURE OF INVENTION

In light of the foregoing, it is a first aspect of the invention to provide an electrical adaptor for interconnection with a switch in which a switch having plug-in terminals can be readily converted to include screw-in terminals.

Another aspect of the invention is the provision of an electrical adapter for interconnection with a switch in which the adapter is received directly by the plug-in terminals of the switch.

Still a further aspect of the invention is the provision of an electrical adapter for interconnection with a switch in which provision is made for the inclusion of a line filter.

Yet another aspect of the invention is the provision of an electrical adapter for interconnection with a switch in which the switch need not be modified for implementation with either plug-in or screw-in terminals.

Still a further aspect of the invention is the provision of an electrical adapter for interconnection with a switch which may be readily employed with presently existing switches and which is reliable and durable in operation, easy to construct, cost effective, and in compliance with the rules of regulating agencies.

An additional aspect of the invention is the provision of a electrical adapter for interconnection with a switch in which motor wires and filter wires enter the adapter on the same side of the adapter, facilitating automatic insertion of the wires thereinto.

The foregoing and other aspects of the invention which will become apparent as the detailed description proceeds are achieved by an electrical adapter for interconnection with a switch having connectors for interconnection with a line voltage source and a motor, comprising: a housing; a first pair of connectors carried by said housing and adapted for mating interconnection with connectors of the switch intended for interconnection with the line voltage; a second pair of connectors carried by said housing and adapted for mating interconnection with connectors of the switch intended for interconnection with the motor; a third pair of connectors carried by said housing for mating interconnection with wires connected to the line voltage; a fourth pair of connectors carried by said housing for mating interconnection with wires connected to the motor; and circuit means carried by said housing for electrically connecting respective ones of said first and third pairs of connectors and respective ones of second and fourth pairs of connectors.

Further aspects of the invention are attained by an electrical adapter for interconnection with a switch having receptacles intended for interconnection with a line voltage source and a motor, comprising; a housing having a top plate and a bottom plate, and being enclosed by side members interconnecting said top and bottom plates; a printed circuit board received within said housing; a first pair of blades connected to said printed circuit board and extending from said housing an adapter for receipt by the receptacles intended for interconnection with the line voltage; a second pair of blades connected to said printed circuit board and extending from said housing and adapted for receipt by the receptacles intended for interconnection with the motor; a first set of receptacles in said housing in communication through said printed circuit board with said first set of blades; and a second set of receptacles in said housing in communication through said printed circuit board with said second set of blades.

BRIEF DESCRIPTION OF DRAWINGS

For a complete understanding of the objects, techniques and structure of the invention references should be made to the following detailed description and accompanying drawings wherein.

BEST MODE FOR CARRYING OUT THE INVENTION

Figure 1:
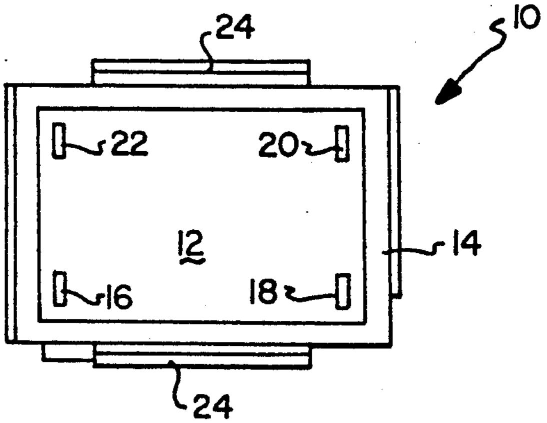
FIG. 1 is a top plan view of the adapter of the invention.
Figure 2:
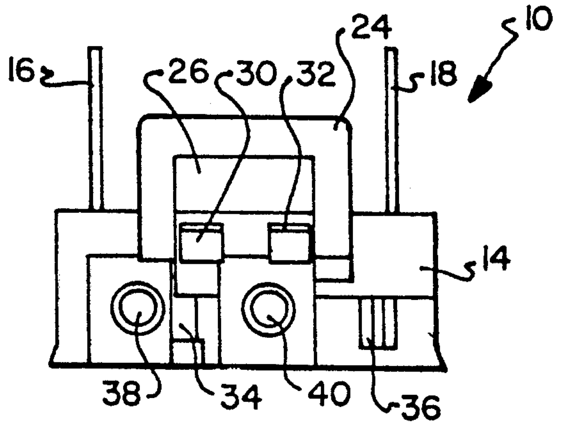
FIG. 2 is a front elevational view of the adapter of the invention.
Figure 3:
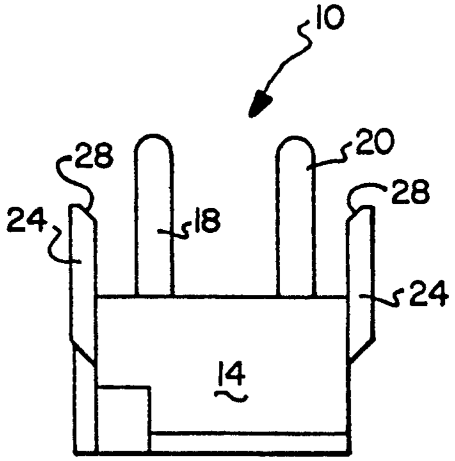
FIG. 3 is a side elevational view of the adapter of the invention.
Figure 4:
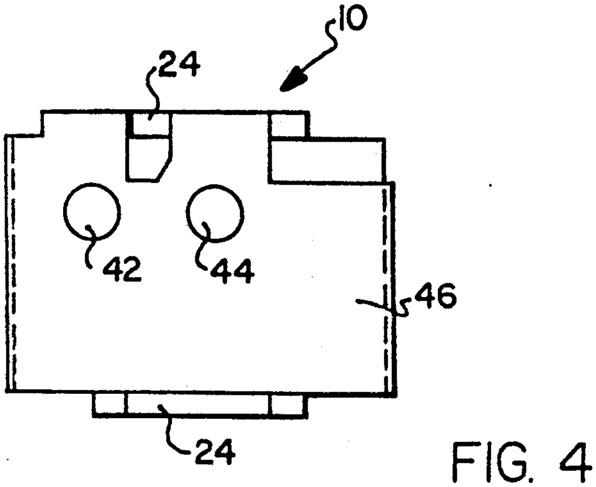
FIG. 4 is a bottom plan view of the adapter of the invention.

Referring now to the drawings and more particularly FIGS. 1–4, the external structure and configuration of the electrical adapter according to the invention can be seen as designated by the numeral 10. As shown, a cap member 12 is received within the confines of a base member 14, both of which are preferably molded of plastic or other suitable nonconductive material. A plurality of electrically conducting blades 16–22 extend from the base member 14 and through the cap member 12 at the corners thereof as illustrated. The blades or prongs 16–22 are so positioned as to be received by the plug-in receptacles of the switch for which the adapter is designed. As will become apparent hereinafter, the blades 16, 20 are positioned to make interconnection with the switch terminals adapted for receiving the line voltage, while the blades 18, 22 are positioned for interconnection with the terminals of the switch which are connected to the motor.

A pair of plastic clips 24 are adhered to the front and back of the adapter 10, each having an opening 26 therein as shown. The plastic clips 24 are adapted for passing over ears extending on either side of the motor switch assembly to which the adapter is to be connected. The clips 24 snap over the ears, with the ears protruding through the openings 26 to achieve the desired locking engagement. Chamferred or beveled edges 28 on the clips 24 facilitate passage thereof over the ears and achievement of the requisite deflection.

Openings 30, 32 in the front of the base member 14 are provided for receipt of motor lead wires from the associated switch. Similarly, openings 34, 36 are provided for receipt of wires or leads of an appropriate filter or noise suppression device. Finally, the front of the base member 14 is characterized by openings 38, 40 which communicate with threaded bores for receipt of screws or the like to clamp or lock line voltage wires received by the openings 42, 44 in the bottom 46 of the base member 14. It will be appreciated that the holes 38–44 provide the requisite screw-in terminals required in many countries other than the United States.

The electrical adapter 10 contains therein an arrangement of a printed circuit board and insulating compartments for making interconnecting engagement between the input wires received through the openings 34–44 with the blades or prongs 16–22. The internal structure of the unit is presented in detailed directly below with reference to FIGS. 5–8.

Figure 5:
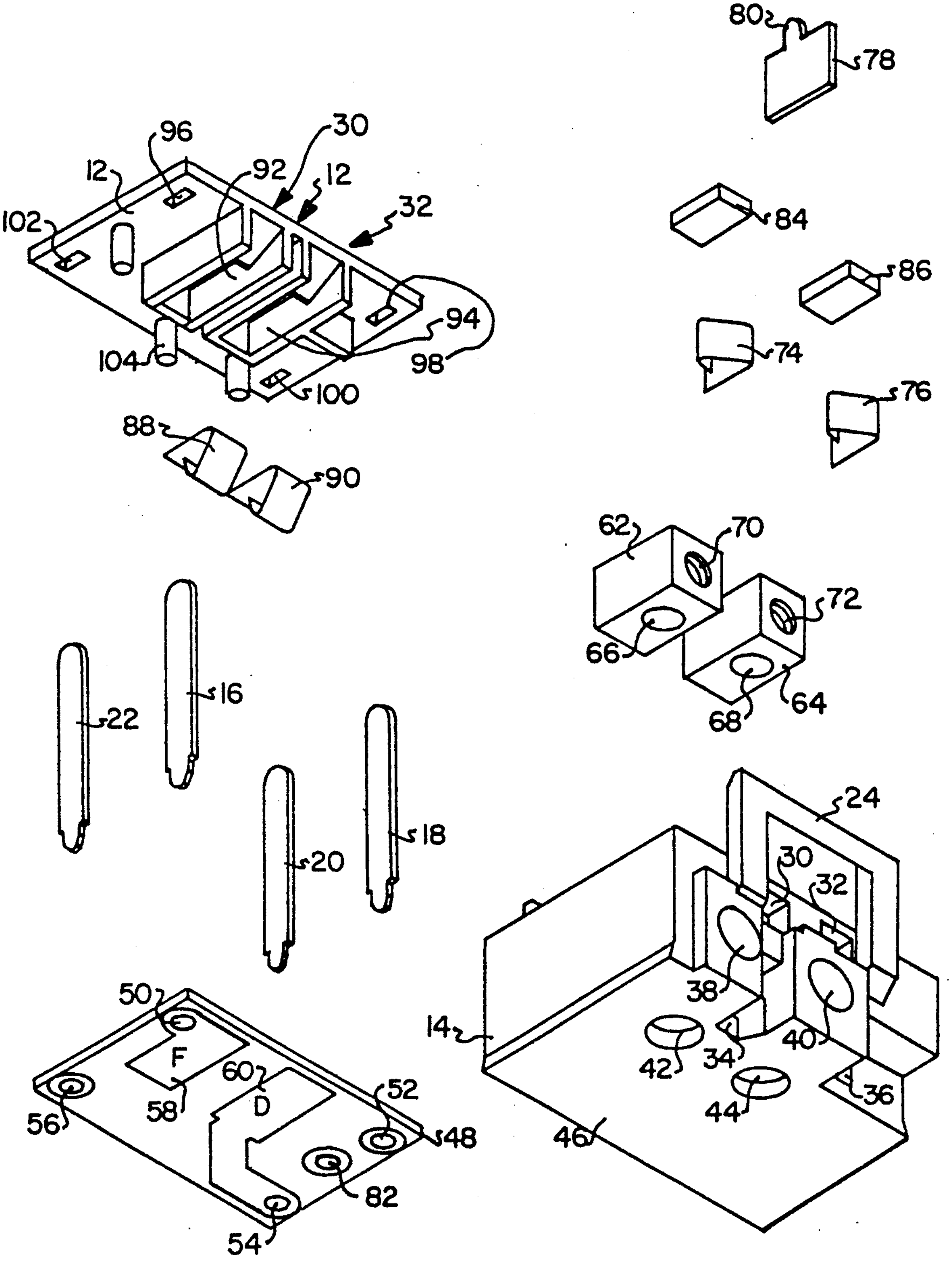
FIG. 5 is an assembly diagram of the adapter of the invention showing the internal structures thereof.

With reference now to FIG. 5, it can be seen that an integral part of the adapter 10 is a printed circuit board 48 received within the base member 14. The printed circuit board, in standard fashion, comprises a mica or appropriate base with electrically conductive lands and printed circuit wires passing over both sides thereof. As shown, plated holes 50, 52, 54, 56 are provided at the corners of the board 48 and are adapted for receiving the ends of the respective blades or prongs 16, 18, 20, 22. With the blades being copper or brass, and the holes 50–56 being appropriately plated or tinned, the ends are readily soldered thereto for proper electrical connection. A conductor pad 58 is plated onto the bottom of the board 48 in communication through the hole 50 with the blade 16. Similarly, a conductor pad 60 is provided in electrical connection through the hole 54 with the blade 20. Conductor blocks 62, 64 are respectively soldered to the pads 58, 60 such that the block 62 is electrically connected to the blade 16 and the block 64 is electrically connected to the blade 20. As mentioned above, these blades are received by the connector of the switch adapted for receipt of line voltage. It will be appreciated that the printed circuit board could be substituted with a hard-wired substrate of a suitable nature, and that certain of the benefits of the invention may be attained absent either a printed circuit board or substrate.

Holes 66, 68 in the bottoms of the connector blocks 62, 64 are in registration with the respective holes 42, 44 in the base 46. Line voltage wires, from an appropriate external voltage source are presented through the holes 42, 44 and received within the bores 66, 68. Threaded holes 70, 72 intersect the bores 66, 68 and are positioned for alignment with the openings 38, 40 in the front of the base member 14. Screws or other appropriate locking means are threadedly secured in the bores 70, 72 to secure the line wires in the blocks 62, 64.

A pair of conductive spring clips 74, 76 are also received within the base member 14, the clip 74 being aligned with the opening 34, and the clip 76 being aligned with the opening 36. So positioned, the clip 74 is operative to engage a filter wire inserted into the opening 34 and to urge it against the conductive connector block 62. In similar fashion, the clip 76 receives the other filter wire through the opening 36 and is adapted to urge it against the electrical contact plate 78. As shown, the plate 78 has a tab 80 extending from the top thereof which is received by a hole in the board 48 having a land 82 thereabout. As will become evident later, this interconnection causes the filter wire passing through the opening 36 to make electrical contact with the blade 22 which engages one of the motor terminals of the associated switch. As shown, a pair of insulating spacers 84, 86 are provided atop the respective clips 74, 76 to hold them in place.

Conductive spring clips 88, 90 are respectively received in compartments 92, 94 provided on the bottom side of the cap member 12. It will be appreciated that the clip 88 communicates with the slanted opening 30 while the clip 90 communicates with the slanted opening 32 adapted to receive the motor lead wires as discussed earlier to urge these wires against the conductor pads 106, 108.

The cap member 12 is provided with slots 96, 98, 100, 102 to respectively receive the blades 16, 18, 20, 22 therethrough. Further, a plurality of spacing pegs 104 extend from the bottom side of the cap member 12 a distance equal to the depth of the walls defining the compartments 92, 94. The pegs and walls are adapted to seat on the top surface of the printed circuit board 48 and to be adhesively attached thereto.

Figure 6:
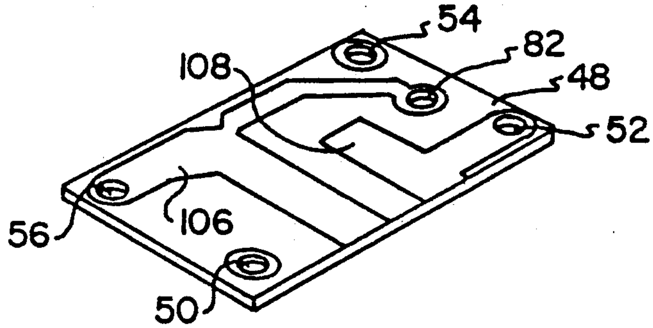
FIG. 6 is a top perspective view of the printed circuit board of the invention, showing the opposite side of the board from that shown in FIG. 5.

FIG. 6 illustrates the top surface of the printed circuit board 48, showing conductor pads 106, 108 presented thereon. It will be appreciated that the conductor pad 106 is electrically connected to the blade 22 and through the spring clip 88 to the motor wire received within the opening 30. This same conductor pad 106 interconnects with the tab 80 of the electrical contact plate 78 to make electrical connection to one of the filter wires via the clip 78 as mentioned above. The conductor pad 108 connects the blade 18 through the clip 90 to an appropriate motor wire received in the opening 32.

Figure 7:
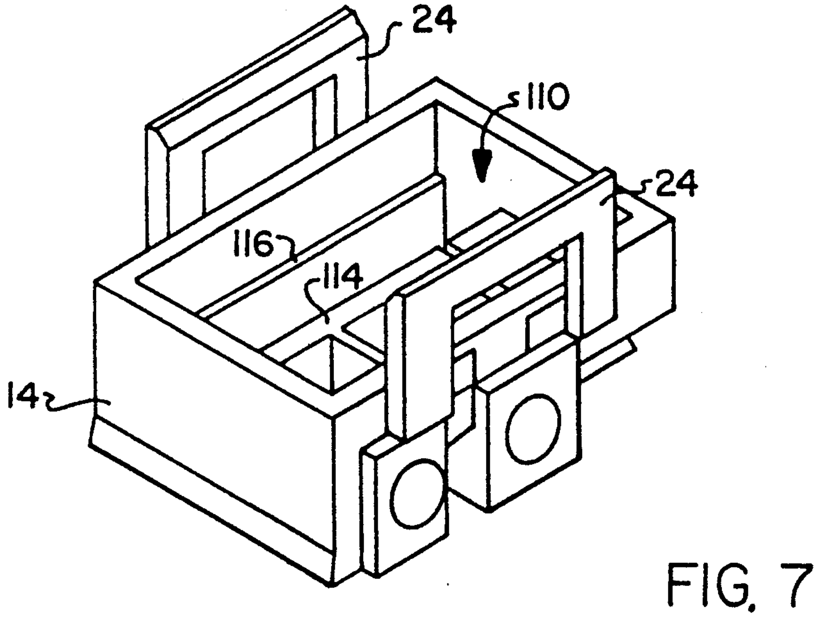
FIG. 7 is an illustrative perspective view of the base member of the adapter of the invention, showing the compartmentalized cavity thereof.

As shown illustratively in FIG. 7, the base member 14 is characterized by a cavity 110 having various compartments 112 defined therein for receiving the various elements 62, 64, 74, 76, 78, 84, 86 as discussed above. Each of the compartments is defined by a wall, all of which share a common top edge 114. There is also provided a ledge 116 extending inwardly along the rear wall of the base member 14. The ledge 116 is at the same elevation as the top edge 114 of the compartments 112. The elements 114, 116 provide a supporting surface for receiving the bottom of the integrated circuit board 48, which is adhesively attached thereto.

Figure 8:
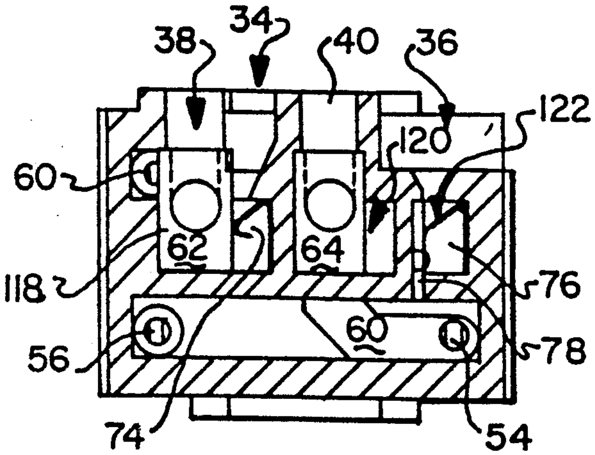
FIG. 8 is a cross sectional view of the adapter of the invention showing the various elements thereof maintained beneath the printed circuit board.

For an appreciation of the positioning of the various elements within the base member 14, reference should be made to the cross sectional view of FIG. 8. As shown, a compartment 118 is provided for receipt of the connector block 62 and clip 74. As shown, the clip 74 is in contacting engagement with the block 62 and in alignment with the opening 34 for receiving a wire biased by the clip 74 against the block 62. In like manner, a compartment 120 is provided for receipt of the block 64. A compartment 122 is provided for receipt of the electrical contact plate 78 and clip 76, the latter being aligned with the opening 36 to receive a wire therein to be biased by the clip 76 against the plate 78.

It should be appreciated that the assembly of the structure just described follows the illustration of FIG. 5, with the soldered interconnection being made as discussed above. The cap member 12 is preferably sealed to the base member 14 by means of a suitable adhesive provided about the peripheral edges of the cap member 12. The result is a secure integral adapter 10, the blades 16–22 of which are so positioned as to be received by a mating switch. It should further be appreciated that the clips 74, 76 for receiving a noise suppression filter or the like are maintained across the connections for the line voltage and the motor. Accordingly, a switch originally proposed for plug-in connections between a motor and a line voltage may be converted such that the interconnection with the line voltage is by means of screw-in connectors. The adapter is provided with a receptacle for an appropriate noise suppressor or filter if such is desired. Finally, the adapter is securely engaged to the switch by means of the provision of plastic clips 24 extending therefrom.

Thus it can be seen that the objects of the invention have been satisfied by the structure presented above. While in accordance with the patent statutes only the best mode and preferred embodiment of the invention has been presented and described in detial, it is to be understood that the invention is not limited thereto or thereby. Accordingly, for an appreciation of the true scope and breath of the invention reference should be made to the following claims.

What is claimed is:

1. An electrical adapter for interconnection with a switch having connectors for interconnection with a line voltage source and a motor, comprising:

a housing;

a first pair of connectors carried by said housing and adapted for mating interconnection with connections of the switch intended for interconnection with the motor;

a second pair of connectors carried by said housing and adapted for mating interconnection with connections of the switch intended for interconnection with the motor;

a third pair of connectors carried by said housing for mating interconnection with wires connected to the line voltage, each of said third pair of connectors comprising a connector block having intersecting passages therein, a first such passage adapted for receiving a wire, and a second such passage being threaded to receive a screw for locking said wire, said connector blocks being in engagement with circuit means;

a fourth pair of connectors carried by said housing for mating interconnection with wires connected to the motor, said fourth pair of connectors comprising first and second spring clips in wire-receiving communication with said circuit means; and said circuit means being carried by said housing for electrically interconnecting respective ones of said first and third pairs of connectors and respective ones of said second and fourth pairs of connectors, said circuit means comprising a printed circuit board, said connector blocks being attached to said printed circuit board and adapted for engaging and urging wires received thereby against said printed circuit board.

2. The electrical adapter according to claim 1, further comprising locking means attached to said housing for securing said housing to the switch.

3. The electrical adapter according to claim 2, wherein said locking means comprises a pair of clips having openings therein adapted for receiving ears on the switch.

4. The electrical adapter according to claim 1, further comprising a fifth pair of connectors carried by said housing and interposed between one of said connectors of each of said third and fourth pairs of connectors.

5. The electrical adapter according to claim 4, wherein said fifth pair of connectors is adapted to receive a filter.

6. The electrical adapter according to claim 5, wherein said first and second pairs of connectors comprise blades extending from said housing.

7. The electrical adapter according to claim 6, wherein each of said fifth pair of connectors comprises a receptacle.

8. The electrical adapted according to claim 7, in which said fifth pair of connectors comprises third and fourth spring clips in wire-receiving communication with said circuit means.

9. The electrical adapter according to claim 8, wherein said third spring clip is biased against one of said connector blocks, and said fourth spring clip is biased against a conductor plate in electrical interconnection with one of said first and second spring clips.

10. An electrical adapter for interconnection with a switch having receptacles intended for interconnection with a line voltage source and a motor, comprising:

a housing having a top plate and a bottom plate, and being enclosed by side members interconnecting said top and bottom plates;

a printed circuit board received within said housing;

a first pair of blades connected to said printed circuit board and extending from said housing, and adapted for receipt by the receptacles intended for interconnection with the line voltage;

a second pair of blades connected to said printed circuit board and extending from said housing, and adapted for receipt by the receptacles intended for interconnection with the motor;

a first set of receptacles in said housing in communication through said printed circuit board with said first set of blades;

a second set of receptacles in said housing in communication through said printed circuit board with said second set of blades; and a third set of receptacles in said housing in communication through said printed circuit board with one of each of said first and second sets of blades.

11. The electrical adapter according to claim 10, wherein said first set of receptacles comprises a pair of conductor blocks, each having a pair of interconnecting passages therein, one for receiving a wire and one for receiving means for securing said wire within said conductor block.

12. The electrical adapter according to claim 11, wherein said second set of receptacles comprises a pair of spring clips in biased engagement with said printed circuit board.

13. The electrical adapter according to claim 12, wherein said third set of receptacles comprises a pair of spring clips, one in engagement with one of said conductor blocks, and one in engagement with a conductive plate connected to said printed circuit board.

14. The electrical adapter according to claim 10, further comprising locking means on opposite sides of said housing for engagement with the switch.

* * * * *